US008217500B1

(12) United States Patent  (10) Patent No.: US 8,217,500 B1
Hool  (45) Date of Patent: Jul. 10, 2012

(54) SEMICONDUCTOR DEVICE PACKAGE

(75) Inventor: Vincent Hool, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 169 days.

(21) Appl. No.: 12/776,241

(22) Filed: May 7, 2010

(51) Int. Cl.
 *H01L 23/02* (2006.01)
(52) U.S. Cl. .............. 257/678; 257/734; 257/E21.499; 257/E21.508; 257/E21.509; 257/E21.511
(58) Field of Classification Search ............ 257/678, 257/673, 734, 737, 738, E21.499, E21.508, 257/E21.509, E21.511
See application file for complete search history.

(56) References Cited

U.S. PATENT DOCUMENTS

| 6,433,412 | B2 * | 8/2002 | Ando et al. | 257/678 |
| 6,888,238 | B1 * | 5/2005 | Li | 257/706 |
| 2010/0208442 | A1 * | 8/2010 | Asano et al. | 361/783 |

* cited by examiner

*Primary Examiner* — David Nhu
(74) *Attorney, Agent, or Firm* — Ward & Zinna, LLC

(57) ABSTRACT

A semiconductor integrated circuit is mounted on the package substrate so that its sides are at approximately a 45 degree angle to the sides of the substrate. As a result, the sides of the die face the corners of the substrate rather than the sides of the substrate. In this orientation, substantially all the space available in the corners of the substrate becomes readily available for use in reducing congestion along the sides of the die and/or routing connections to the die and/or in mounting coupling capacitors. It also becomes possible to mount a larger die on the substrate while still meeting manufacturing and reliability rules. Larger stiffener/lid structures may also be used for enhanced adhesion to the substrate.

22 Claims, 3 Drawing Sheets

SEMICONDUCTOR DEVICE PACKAGE

BACKGROUND OF THE INVENTION

This relates generally to the packaging of semiconductor devices.

FIGS. 1 and 2 depict a cross-section and a top view of typical semiconductor device packages. In FIG. 1, package 100 comprises a substrate 110 on which is mounted a semiconductor integrated circuit die 120 in a flip-chip configuration. Die 120 is mechanically and electrically connected to substrate 110 by an array 125 of solder balls or solder bumps located between the die and the substrate. In many embodiments, an underfill 127 is also used to secure the die to the substrate. A second array 130 of solder balls or solder bumps provides mechanical and electrical connection between the package substrate 110 and the next level of packaging to which package 100 is connected. Electrical connection between solder balls 130 and solder balls 125 is provided by vias 140 that extend vertically through substrate 110 and wiring traces or planes 145 that extend horizontally across the upper surface of substrate 110 and/or through substrate 110 in one or more layers.

As in many prior art packages, a lid 150 is used to enclose the die on the substrate. A stiffener 155 is located on the periphery 115 of the substrate between the lid and the substrate so as to reduce warpage of the substrate. Alternatively, the stiffener could be formed as part of the lid. Further details on various lid structures are set forth in U.S. Pat. No. 6,888,238 of Altera Corporation, which is incorporated herein in its entirety.

The switching of input/output (I/O) circuits and the power delivery system for the semiconductor integrated circuit require large amounts of transient electric current. The electric charge for this current is conventionally stored in decoupling capacitors connected between the power and ground lines connected to the integrated circuit. In some semiconductor packages, these capacitors are mounted on substrate 110 along the four sides of integrated circuit die 120. In the cross-section of FIG. 1, two of these capacitors are identified as elements 160.

FIG. 2 is a top view of a similar integrated circuit package 200 with its lid removed. Corresponding elements of package 200 have been given the same numbers as the corresponding elements of FIG. 1 incremented by 100. Package 200 comprises a substrate 210 on which is mounted a semiconductor integrated circuit die 220. Line 270 indicates the approximate point on the periphery 215 of substrate 210 where the inner edge of the stiffener/lid would contact the substrate. When the stiffener/lid is in place, the stiffener/lid preferably contacts the substrate over substantially the entire peripheral area between line 270 and the sides of the substrate. Substrate 210 is rectilinear having four sides with adjacent sides meeting at right angles. Die 220 is also rectilinear having four sides with adjacent sides meeting at right angles. Illustratively, as shown in FIG. 2, both the substrate and the die are approximately square and the die is mounted so that it is centered on the substrate with the sides of the die parallel (and perpendicular) to the sides of the substrate. In other embodiments, the substrate and/or the die may be rectangular with two parallel sides that are appreciably different in length from the other two parallel sides. When the die is mounted on the substrate in a flip-chip configuration, the solder balls or solder bumps (not shown in FIG. 2) are typically arranged in a rectilinear array of rows and columns of solder balls or solder bumps parallel to the sides of die 220. Similarly, the solder balls or solder bumps (not shown in FIG. 2) that connect the package to other packaging levels are arranged in a rectilinear array of rows and columns parallel to the sides of substrate 210.

Decoupling capacitors may be connected between the power and ground lines connected to integrated circuit die 220. As in the case of capacitors 160 of FIG. 1, these capacitors may be mounted on substrate 210 between integrated circuit die 220 and the stiffener/lid. These capacitors are not shown in FIG. 2 to avoid undue complexity in the drawing.

Wiring traces 245 extend horizontally across and/or through substrate 210 to connect integrated circuit die 220 to the solder balls or solder bumps that connect the package to other packaging levels. Wiring traces or planes 245 also extend across and/or through substrate 210 to connect the decoupling capacitors (not shown) between power and ground lines. As shown in FIG. 2, the distribution of wiring traces varies along the periphery of the die and the periphery of the substrate. In particular, the distribution is quite sparse in the four corners 280 of the substrate defined by extending the sides of the die until they intersect the sides of the substrate and is much denser in the four mid-sections 285 between corners 280 and die 220. This variation in distribution is the source of significant inefficiencies in the use of the limited space on the substrate. For example, in the case where the substrate and the die are both square and the side of the substrate is twice the length of the side of the die, the area of the substrate is four times the area of the die. One-quarter of the space on the substrate is covered by the die; one-quarter of the space is in the four corners 280; and one-half the space is in the four mid-sections 285 between the four corners and the die. Thus, one-third of the available space on the die is sparsely utilized.

SUMMARY OF THE PRESENT INVENTION

The present invention is a semiconductor package design that better utilizes the available space on the package substrate.

In a preferred embodiment of the invention, the semiconductor integrated circuit is mounted on the package substrate so that its sides are at an angle of approximately 45 degrees with the sides of the substrate. As a result, the sides of the die face the corners of the substrate rather than the sides of the substrate. In this orientation, substantially all the space available in the corners of the substrate becomes readily available for use in reducing congestion along the sides of the die and/or routing connections to the die and/or in mounting coupling capacitors. It also becomes possible to mount a larger die on the substrate while still meeting manufacturing and reliability rules. Larger stiffener/lid structures may also be used for enhanced adhesion to the substrate.

To a lesser degree, the advantages of the invention may also be attained when the sides of the die make other non-90 degree angles with the sides of the substrate.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
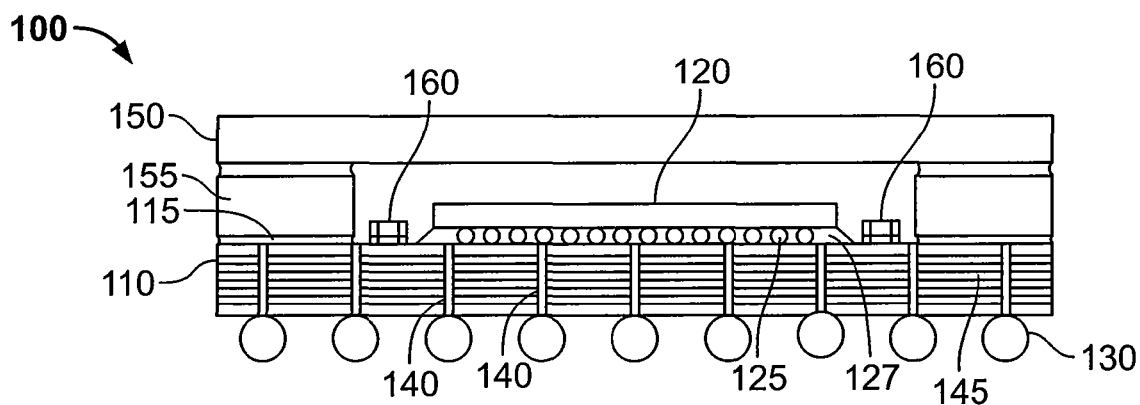
FIG. 1 is a cross-section of an illustrative prior art semiconductor package.
Figure 2:
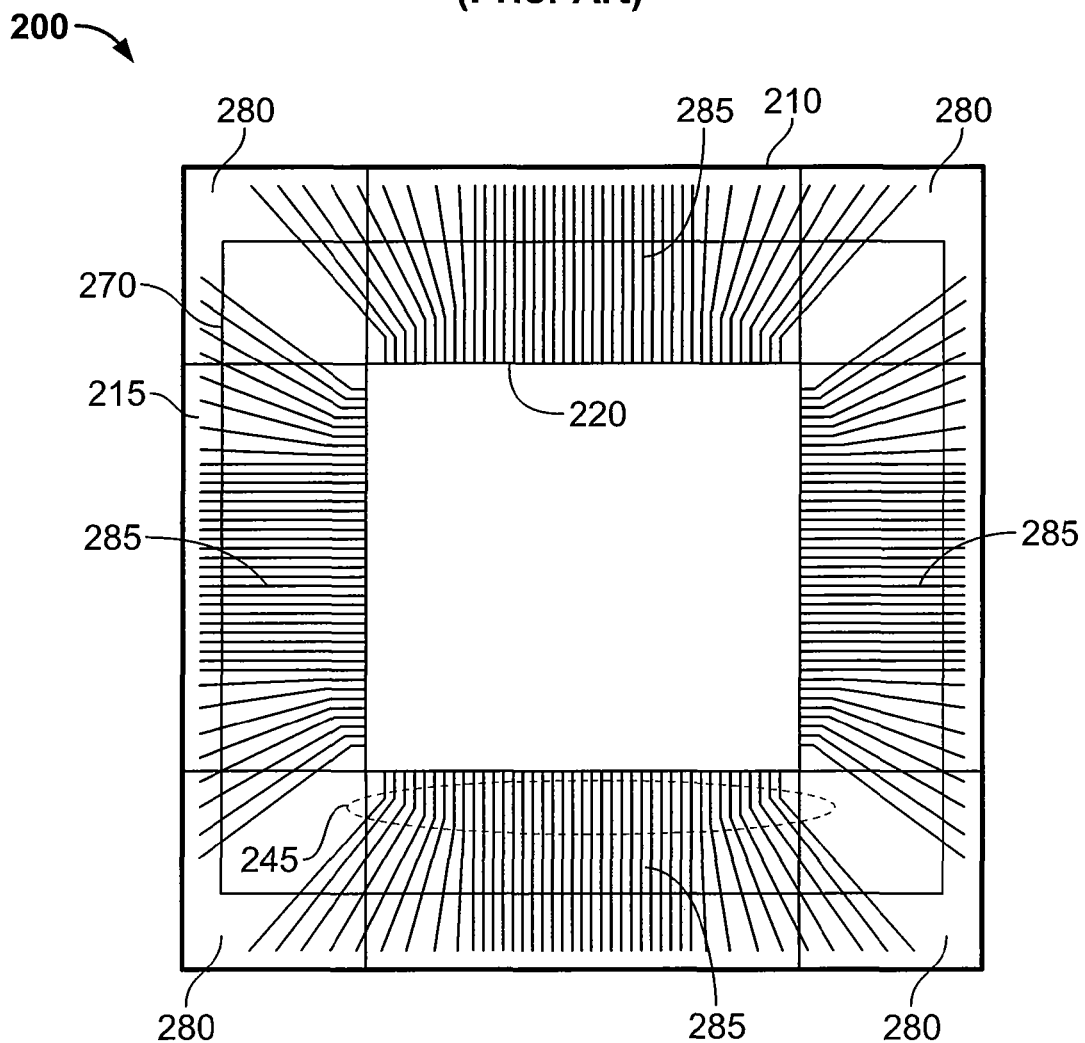
FIG. 2 is a top view of an illustrative prior art semiconductor package.
Figure 3:
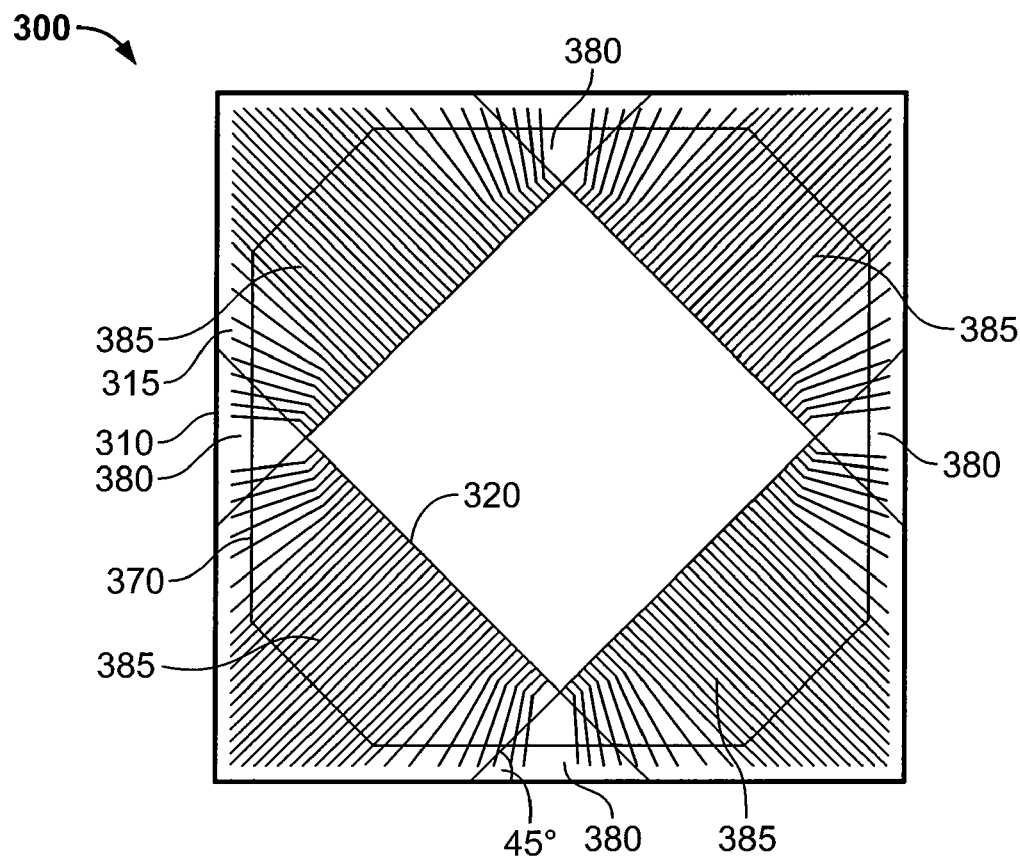
FIG. 3 is a top view of a first illustrative embodiment of the invention.

FIG. 3 is a top view of a first illustrative embodiment of an integrated circuit package 300 of the present invention. As in the case of the top view of FIG. 2, the lid of the package has been removed. Package 300 comprises a substrate 310 on which are mounted a semiconductor integrated circuit die 320 and several capacitors 360 (see FIG. 4) on each side of the die. Line 370 indicates the approximate point on the periphery 315 of substrate 310 where the inner edge of the stiffener/lid would contact the substrate. When the stiffener/lid is in place, the stiffener/lid preferably contacts the peripheral area of the substrate over substantially the entire region between line 370 and the sides of the substrate. Substrate 310 is rectilinear having four sides with adjacent sides meeting at right angles. Die 320 is also rectilinear having four sides with adjacent sides meeting at right angles. Illustratively, as shown in FIG. 3, both the substrate and the die are approximately square and the die is mounted so that it is centered on the substrate with the sides of the die at an angle of approximately 45 degrees with the sides of the substrate As a result, the sides of the die face the corners of the substrate rather than the sides of the substrate as in the prior art embodiment, of FIG. 2. In other embodiments, the substrate and/or the die may be rectangular with two parallel sides that are appreciably different in length from the other two parallel sides.

Figure 4:
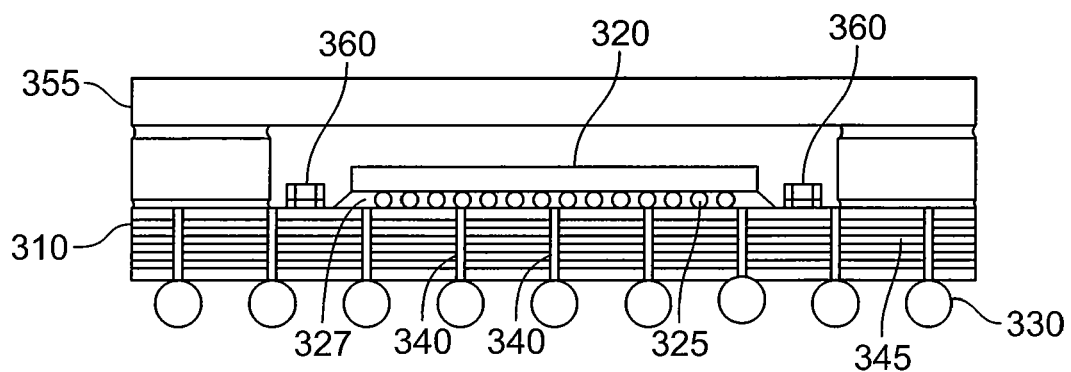
FIG. 4 is a cross-section of the first illustrative embodiment of the invention.

When die 320 and substrate 310 are mounted in flip-chip configurations, FIG. 4 is a typical cross-section of the package parallel to a side of the die. Die 320 is mechanically and electrically connected to substrate 310 by an array 325 of solder balls or solder bumps located between die 320 and substrate 310. An underfill 327 may also be used to secure the die to the substrate. A second array 330 of solder balls or solder bumps 330 provides mechanical and electrical connection between the package substrate 310 and the next level of packaging to which package 300 is connected. Electrical connection between solder balls 330 and solder balls 325 is provided by vias 340 that extend vertically through substrate 310 and wiring traces or planes 345 that extend horizontally across the upper surface of substrate 310 and/or through substrate 310 in one or more layers. Similarly, capacitors 360 are connected between power and ground lines in the wiring traces or planes 345.

As will be evident from FIG. 3, the four mid-section regions 385 on substrate 310 that are directly opposite the sides of die 320 are significantly greater in size than the four mid-section regions 285 on substrate 210 that are directly opposite the sides of die 220. Conversely, the corner regions 380 formed by extending the sides of the die until they intersect the sides of the substrate are much smaller. In the case where the substrate and die of the package of FIG. 3 are the same size as the substrate and die of the package of FIG. 2, it can be shown that the area of the four corner regions 380 is approximately 36% of the area of the four corner regions 280. Conversely, the area of the four mid-section regions 385 is approximately 132% of the area of the four mid-section regions 285 in the prior art package of FIG. 2. This additional area makes it possible to reduce some of the congestion in the mid-section regions and/or allows for the mounting of larger dies and/or additional coupling capacitors on the same size substrate. It also permits the mounting of larger stiffener/lid structures in the four corners of the substrate which can be used to enhance the adhesion of the stiffener/lid to the substrate. For example, as shown in FIG. 3, four large triangular areas are available in the four corners of substrate 310 to which may be secured similarly shaped portions of the stiffener/lid.

Other advantages of the invention relate to increased flexibility in routing wiring traces. For example, in prior art configurations such as those of FIG. 2, I/O and power connections on one side of a die are ordinarily routed to the side of the substrate nearest them and it is relatively difficult to route such connections to any other side of the substrate. As a result, in the case of transceiver I/O which is ordinarily located on two opposing sides of a die, it is difficult to provide transceiver I/O on all four sides of the package unless changes are made in the floor planning of the transceiver I/O die. With the present invention, however, since each side of the die faces two sides of the package substrate, the necessary routing can be accomplished in the wiring traces in the substrate.

Figure 5:
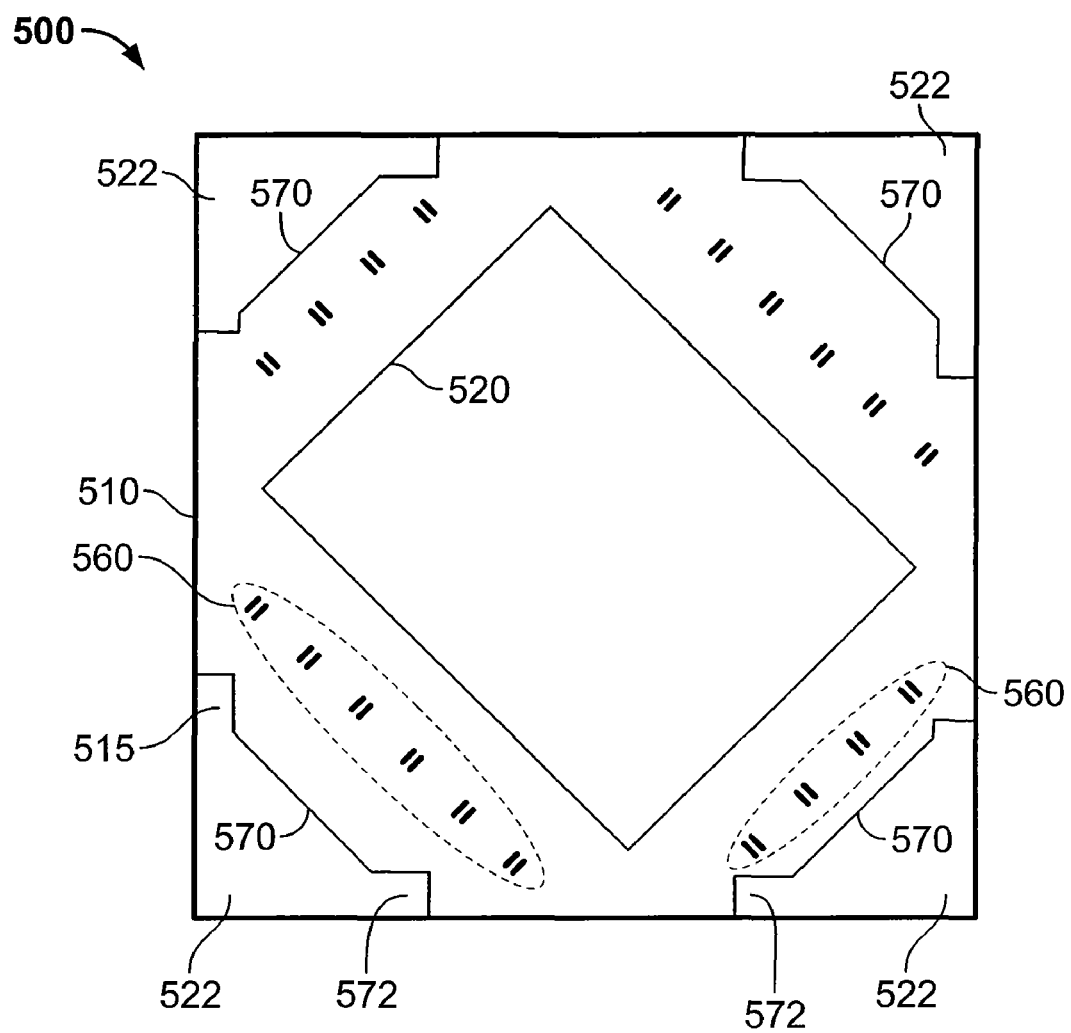
FIG. 5 is a top view of a second illustrative embodiment of the invention.

FIG. 5 is a top view of a second illustrative embodiment of an integrated circuit package 500 of the present invention. As in the case of the top view of FIGS. 2 and 3, the lid of the package has been removed. Package 500 comprises a substrate 510 on which are is mounted a semiconductor integrated circuit die 520 and several capacitors 560 on each side of die 520. Lines 570 indicate the approximate points on the periphery 515 of substrate 510 where the inner edges of the stiffener/lid would contact the four corners 512 of the substrate. When the stiffener/lid is in place, the stiffener/lid preferably contacts substantially the entire area between lines 570 and the corners of the substrate. Substrate 510 is square having four equal sides with adjacent sides meeting at right angles. Die 520 is rectangular having four sides with adjacent sides meeting at right angles and is mounted so that it is centered on the substrate with the sides of the die at an angle of approximately 45 degrees with the sides of the substrate As a result, the sides of the die face the corners of the substrate rather than the sides of the substrate as in the prior art embodiment of FIG. 2.

While substrate 510 is the same size as substrate 310, die 520 is approximately 20% larger than die 320 even though mounted on the same size substrate.

FIG. 5 also depicts a different stiffener/lid configuration in which the stiffener/lid has four corner posts that contact substrate 520 only in the four corners 522 of the substrate. The stiffener/lid is also notched with notches 572 that provide additional strength to the stiffener/lid. Still other stiffener/lid configurations such as those described in the above-cited U.S. Pat. No. 6,888,238 may be used in the practice of the invention.

As will be apparent to those skilled in the art, numerous variations may be practiced in the embodiments depicted in FIGS. 3-5. While the invention has been illustrated with a die that is placed on the substrate with the sides of the die at an angle of 45 degrees to the sides of the substrate, the advantages of the invention may be attained when the die is placed so that its sides are at other angles to the sides of the substrate. In general, significant improvements are observed when the angles between the sides of the die and the sides of the substrate are in the range of 30 to 60 degrees; and lesser improvements are observed when the angles are in the ranges between 10 to 30 degrees and 60 to 80 degrees.

What is claimed is:
1. A semiconductor package comprising:
a package substrate having four sides with right angles between the sides; and
a semiconductor die having four sides with right angles between the sides of the semiconductor die, the semiconductor die being mounted in a center of the package substrate so that the sides of the semiconductor die are at an angle in the range of 10 to 80 degrees to the sides of the package substrate.

2. The semiconductor package of claim 1 further comprising a lid or a stiffener mounted on the package substrate between the semiconductor die and the sides of the package substrate.

3. The semiconductor package of claim 2 wherein the lid or stiffener has four sides that contact the package substrate along the four sides of the package substrate.

4. The semiconductor package of claim 2 wherein the lid has four posts that contact the package substrate at four corners of the package substrate.

5. The semiconductor package of claim 2 further comprising at least one capacitor mounted on the package substrate between the semiconductor die and the lid or stiffener.

6. The semiconductor package of claim 2 further comprising capacitors mounted on the package substrate between each of the four sides of the semiconductor die and the lid or stiffener.

7. The semiconductor package of claim 1 wherein the sides of the semiconductor die are at an angle of approximately 45 degrees to the sides of the package substrate.

8. The semiconductor package of claim 1 wherein the sides of the semiconductor die are at an angle in the range of 30 to 60 degrees to the sides of the package substrate.

9. The semiconductor package of claim 1 wherein the package substrate is square.

10. The semiconductor package of claim 9 wherein the semiconductor die is square.

11. The semiconductor package of claim 9 wherein the semiconductor die is rectangular.

12. A semiconductor package comprising:
    a package substrate having four sides with right angles between the sides;
    a semiconductor die having four sides with right angles between the sides of the semiconductor die, the semiconductor die being mounted in a center of the package substrate so that the sides of the semiconductor die are at an angle in the range of 10 to 80 degrees to the sides of the package substrate; and
    a lid or a stiffener mounted on the package substrate between the semiconductor die and the sides of the package substrate.

13. The semiconductor package of claim 12 wherein the lid or stiffener has four sides that contact the package substrate along the four sides of the package substrate.

14. The semiconductor package of claim 12 wherein the lid has four posts that contact the package substrate at four corners of the package substrate.

15. The semiconductor package of claim 12 further comprising at least one capacitor mounted on the package substrate between the semiconductor die and the lid or stiffener.

16. The semiconductor package of claim 12 further comprising capacitors mounted on the package substrate between each of the four sides of the semiconductor die and the lid or stiffener.

17. The semiconductor package of claim 12 wherein the sides of the semiconductor die are at an angle of approximately 45 degrees to the sides of the package substrate.

18. The semiconductor package of claim 12 wherein the sides of the semiconductor die are at an angle in the range of 30 to 60 degrees to the sides of the package substrate.

19. The semiconductor package of claim 18 wherein the package substrate is square.

20. The semiconductor package of claim 18 wherein the semiconductor die is square.

21. A semiconductor package comprising:
    a package substrate having four sides with right angles between the sides; and
    a semiconductor die having four sides with right angles between the sides of the semiconductor die, the semiconductor die being mounted in a center of the package substrate so that the sides of the semiconductor die are at an angle in the range of 30 to 60 degrees to the sides of the package substrate.

22. The semiconductor package of claim 21 wherein the sides of the semiconductor die are at an angle of approximately 45 degrees to the sides of the package substrate.

\* \* \* \* \*